(12) United States Patent
Sykes et al.

(10) Patent No.: US 10,181,674 B1
(45) Date of Patent: Jan. 15, 2019

(54) COMPOSITE ELECTRICAL CONNECTOR SYSTEM

(71) Applicant: Phoenix Contact Development and Manufacturing, Inc., Middletown, PA (US)

(72) Inventors: Michael Timothy Sykes, Mechanicsburg, PA (US); John P. Huss, Jr., Harrisburg, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 0 days.

(21) Appl. No.: 15/672,758

(22) Filed: Aug. 9, 2017

(51) Int. Cl.
| | |
|---|---|
| *H01R 13/506* | (2006.01) |
| *H01R 13/436* | (2006.01) |
| *H01R 13/11* | (2006.01) |
| *H05K 7/20* | (2006.01) |

(52) U.S. Cl.
CPC ......... *H01R 13/506* (2013.01); *H01R 13/114* (2013.01); *H01R 13/4361* (2013.01); *H05K 7/20* (2013.01); *H05K 7/20154* (2013.01)

(58) Field of Classification Search
CPC .............................. H05K 7/20154; H05K 7/20
USPC ......................................... 439/485, 486, 487
See application file for complete search history.

(56) References Cited

U.S. PATENT DOCUMENTS

| | | | |
|---|---|---|---|
| 5,141,702 A | 8/1992 | Guenin et al. | |
| 6,602,091 B2 | 8/2003 | Belady et al. | |
| 6,747,542 B1 | 6/2004 | Hoehn | |
| 7,476,108 B2 | 1/2009 | Swain et al. | |
| 7,922,518 B1* | 4/2011 | Takehara | H01R 13/6215 439/485 |
| 8,363,410 B2 | 1/2013 | Kobori et al. | |
| 9,136,645 B1 | 9/2015 | Yu | |
| 9,252,512 B2* | 2/2016 | Debabrata | H01R 12/7088 |
| 9,325,097 B2* | 4/2016 | Do | H01R 13/405 |
| 2008/0318464 A1* | 12/2008 | Yuan | H01R 13/447 439/485 |
| 2010/0144172 A1 | 6/2010 | Pavlovic | |
| 2011/0143580 A1* | 6/2011 | Lee | H05K 7/20445 439/485 |
| 2011/0287658 A1 | 11/2011 | Yu et al. | |
| 2012/0224374 A1* | 9/2012 | Aliberti | H05B 33/0803 362/249.02 |
| 2013/0064512 A1* | 3/2013 | Ghantiwala | G02B 6/4269 385/92 |
| 2014/0141647 A1 | 5/2014 | Do | |

(Continued)

OTHER PUBLICATIONS

Phoenix Contact, PCB terminal bocks and plug-in connectors for power electronics—COMBICON power; PC 16 series plug-in connectors up to 1 mm(2); PC 35 series plug-in connectors up to 35 mm(2); pp. 490-499; Standard PC35 Power Contacts, dated before Aug. 2017

(Continued)

*Primary Examiner* — Tho D Ta
*Assistant Examiner* — Marcus Harcum
(74) *Attorney, Agent, or Firm* — Hooker & Habib, P.C.

(57) ABSTRACT

A heat dissipating power electrical connector assembly has a contact housing, a metal contact in the housing, a heat dissipating member with a surface for heating adjacent air and a non-metal heat transmitting member for flowing heat from the contact to the heat dissipating member.

33 Claims, 14 Drawing Sheets

(56) References Cited

U.S. PATENT DOCUMENTS

| | | | |
|---|---|---|---|
| 2014/0334106 A1* | 11/2014 | Prest | C22C 45/00 |
| | | | 361/718 |
| 2014/0349514 A1* | 11/2014 | Yang | H01R 13/6581 |
| | | | 439/487 |
| 2014/0356985 A1 | 12/2014 | Ricci et al. | |
| 2015/0050830 A1 | 2/2015 | Debabrata | |
| 2015/0250074 A1* | 9/2015 | Matsumoto | H05K 7/20936 |
| | | | 361/696 |
| 2015/0280368 A1 | 10/2015 | Bucher | |
| 2016/0373054 A1* | 12/2016 | Wang | H05K 7/20 |
| 2017/0368795 A1* | 12/2017 | Kutsumizu | B32B 9/04 |

OTHER PUBLICATIONS

"Basic Properties and Application Examples of PGS Graphite Sheet," Panasonic ideas for life, 16 pages, dated before Aug. 2017.
High-Temperature Graphitized Macromolecular Film, Panasonic—4 pages, dated before Aug. 2017.
Dow Corning TC-3040 Thermally Conductive Gel, 2 pages, dated before Aug. 2017.

\* cited by examiner

COMPOSITE ELECTRICAL CONNECTOR SYSTEM

FIELD OF THE DISCLOSURE

Electric power is distributed from a power source to a power consumer through a circuit conventionally including conductors and electrical connectors joined to the conductors for establishing make-and-break connections as desired.

Power distribution circuits handle high amperage current flow which may range from a few amps to hundreds of amps. Current flowing through metal electrical contacts in the connectors generates heat in the contacts. The contacts must be sufficiently large to handle the current flow without generating sufficient resistance heat to increase the temperature of the contacts sufficiently to injure the contacts, their surrounding housings or nearby components. In order to prevent undesired heating, conventional metal contacts have large cross sectional areas to reduce resistance. This increases contact cost and size and the size of the contact housings.

There is a need for an improved electrical connector system for power distribution which effectively removes heat generated in the contacts by the flow of electricity through the contacts. Heat should be removed from the contacts and dissipated away from the contacts. Removal of resistance-generated heat permits reduction of contact size and cost. The present invention relates to an improved composite electrical connector system with complimentary heat removal connector assemblies for use in a power distribution circuit.

Each connector assembly includes metal contacts which engage corresponding contacts in the complimentary assembly to form desired electrical power distribution connections. Current flowing through the contacts generates heat which is transmitted away from the contacts by highly conductive non-metal strips mounted on the contacts by heat-transfer pressure connections. The strips rapidly and efficiently flow heat away from the contacts to heat distribution members located away from the contacts. The contacts are held in heat transfer pressure connections with the highly conductive strips. Heat flowed from the contacts and through the strips to the heat distribution members heats the members which radiate the heat into adjacent air for flow away from the connectors and dissipation. The heat distribution members have heat dissipation surfaces in a recess in a contact housing. Air flows into and out of the recess through one or more openings. Alternatively, the heat dissipation surfaces may be outside the contact housings.

Heat removal from an electrical connector assembly is increased by increasing the thermal conductivity of the heat distribution members contacting the ends of the conductive strips located away from the metal contacts. Specialty material having a high thermal conductivity may be used for this purpose, including resins and metal.

The highly conductive strips which transfer heat from the contacts to the heat distribution members may be formed from pyrolytic highly oriented (PGS) graphite.

DETAILED DESCRIPTION

Figure 1:
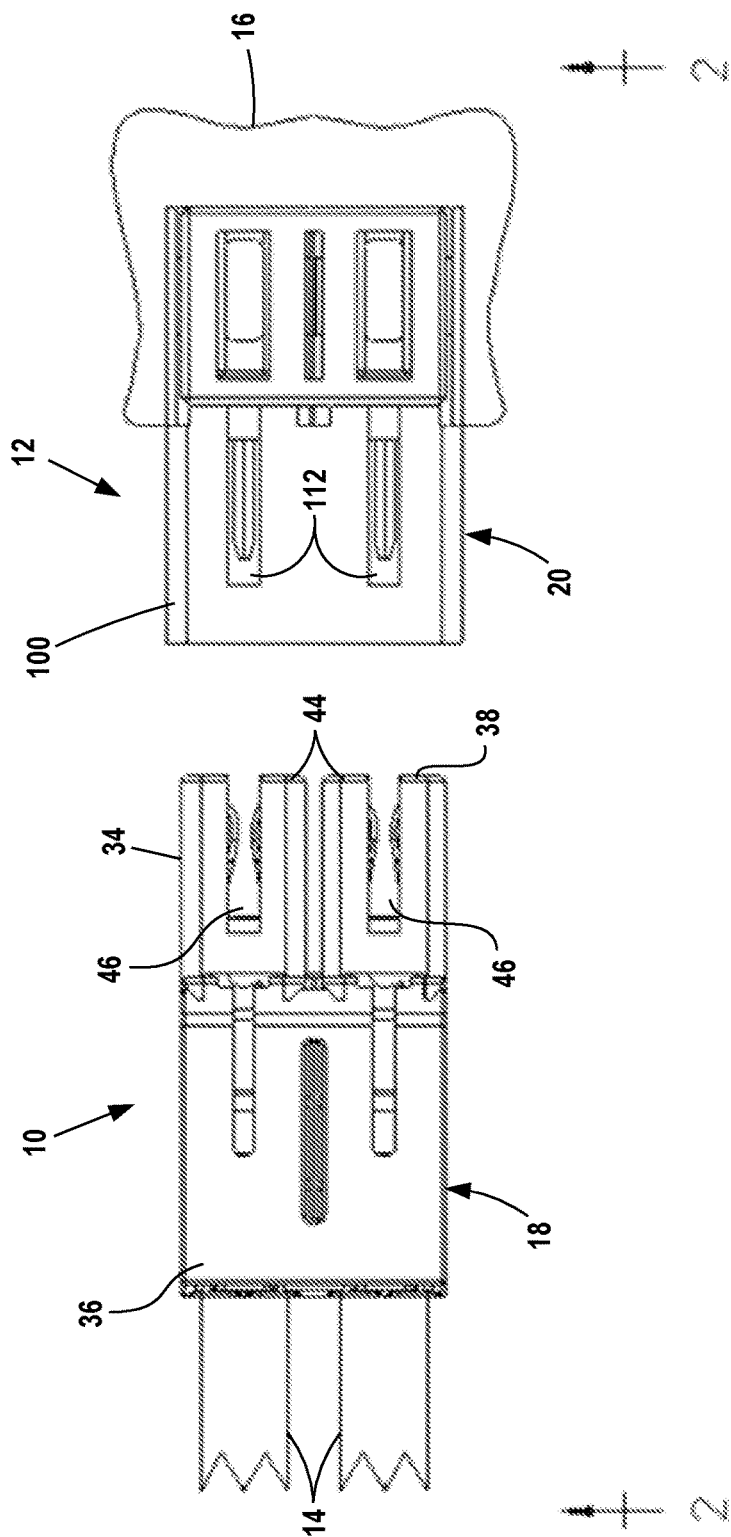
FIG. 1 is a top view of two complementary heat dissipating electrical connector assemblies in position to be engaged.
Figure 2:
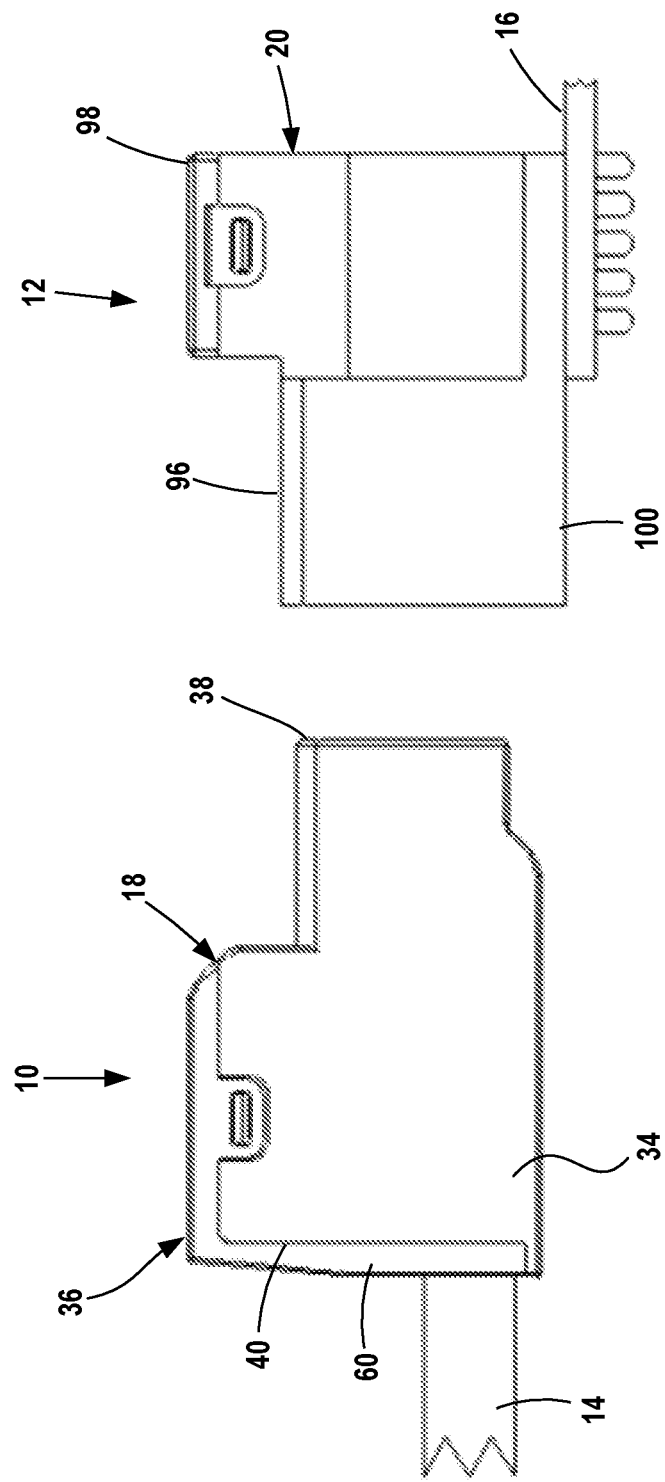
FIG. 2 is a side view of the assemblies of FIG. 1 taken along line 2-2.
Figure 3:
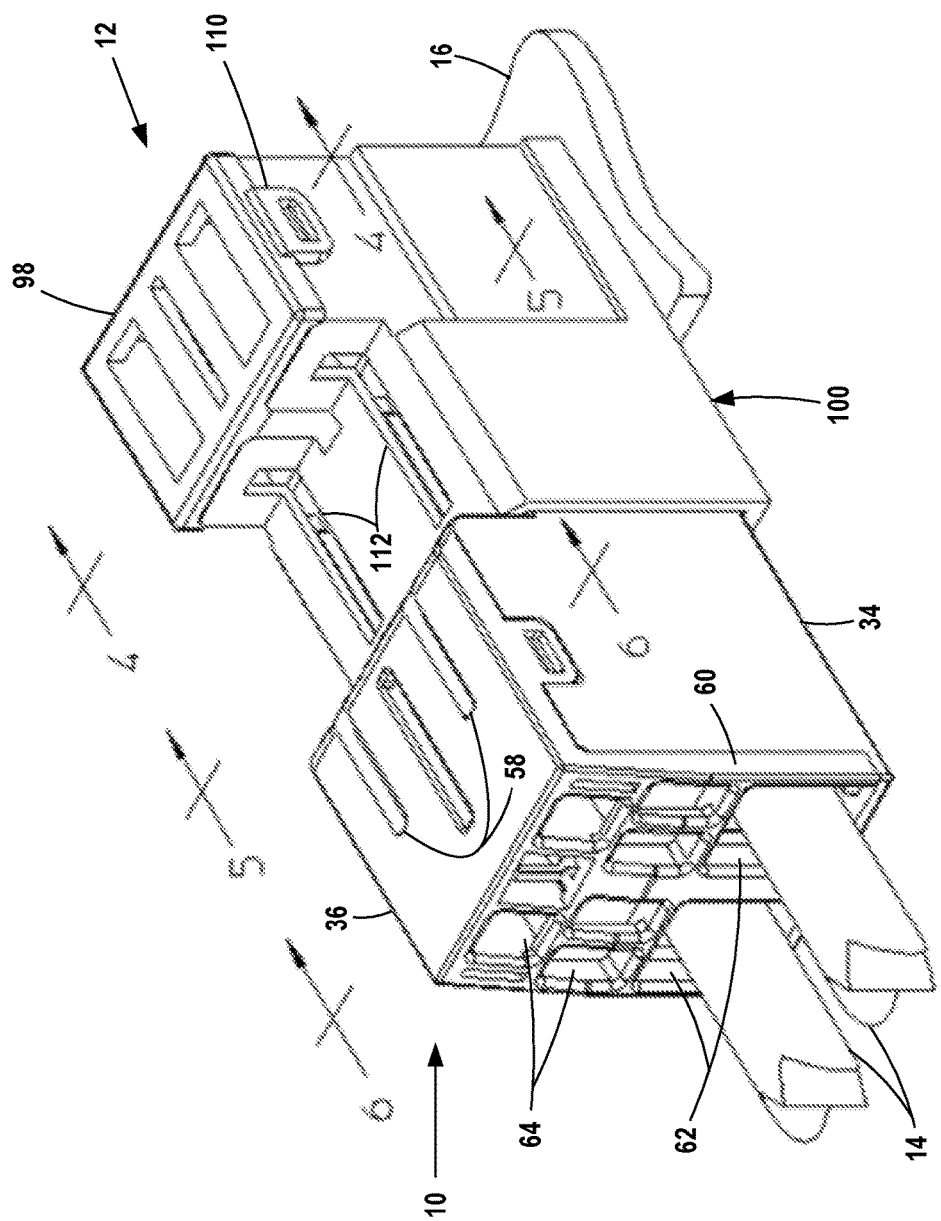
FIG. 3 is a perspective view of the assemblies of FIG. 1 when engaged.

FIGS. 1-3 illustrate complimentary cable electrical connector assembly 10 and circuit board electrical connector assembly 12. Cable assembly 10 is mounted on the ends of two power cables 14. Circuit board assembly 12 is mounted on circuit board 16. The assemblies, when engaged as shown in FIG. 3, form power transmitting electrical connections between cables 14 and circuitry on board 16. The cables may be connected to a power source.

Cable electrical connector assembly 10 includes a contact housing 18 formed from molded thermoplastic resign. Two cable contacts 22 are mounted in side-by-side recesses 24 in cable assembly 10.

Circuit board assembly 12 includes contact housing 20 formed from molded thermoplastic resin. Two circuit board contacts 26 are mounted in side-by-side recesses 28 in circuit board assembly 12.

Two heat conducting strips 30 are attached in surface-to-surface thermal transfer engagement with the cable contacts 22. Two heat conducting strips 32 are attached in clamped surface-to-surface thermal transfer engagement with circuit board contacts 26. Current flowing through contacts 22 and 26 heats the contacts. The strips 30 and 32 flow this heat away from the contacts.

Figure 6:
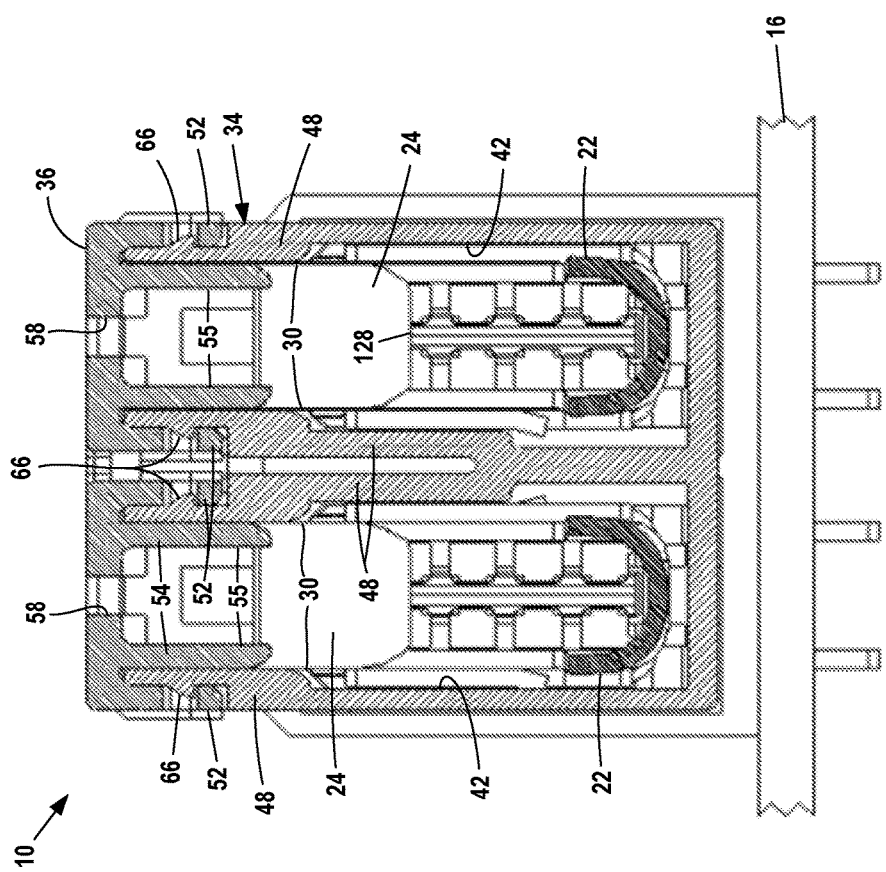
Figure 7:
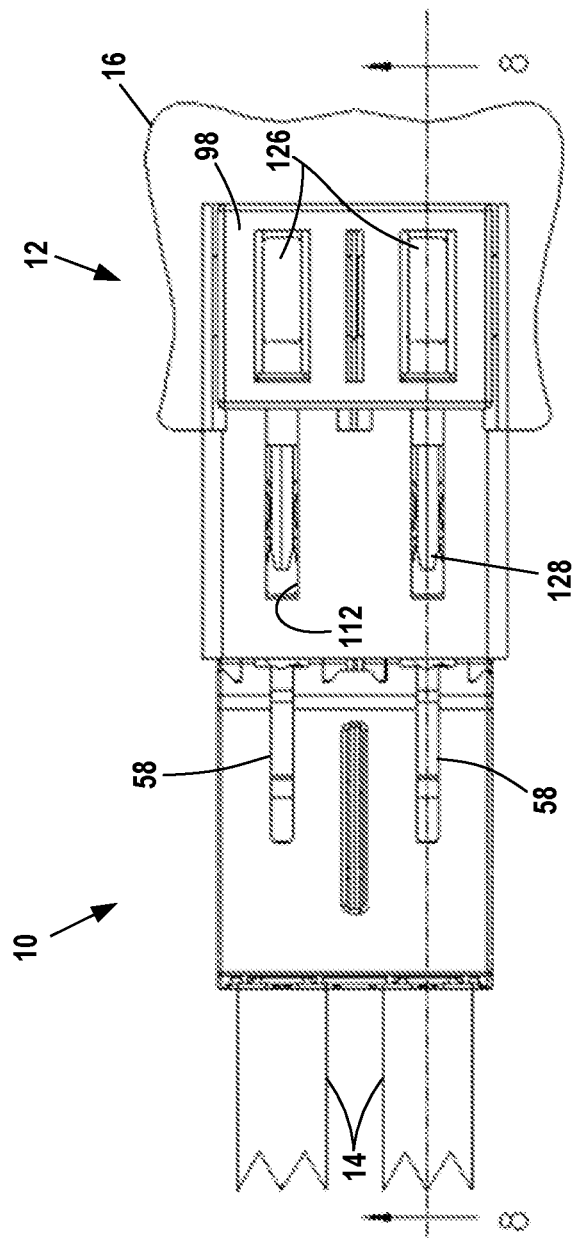
FIG. 7 is a top view of FIG. 3.
Figure 8:
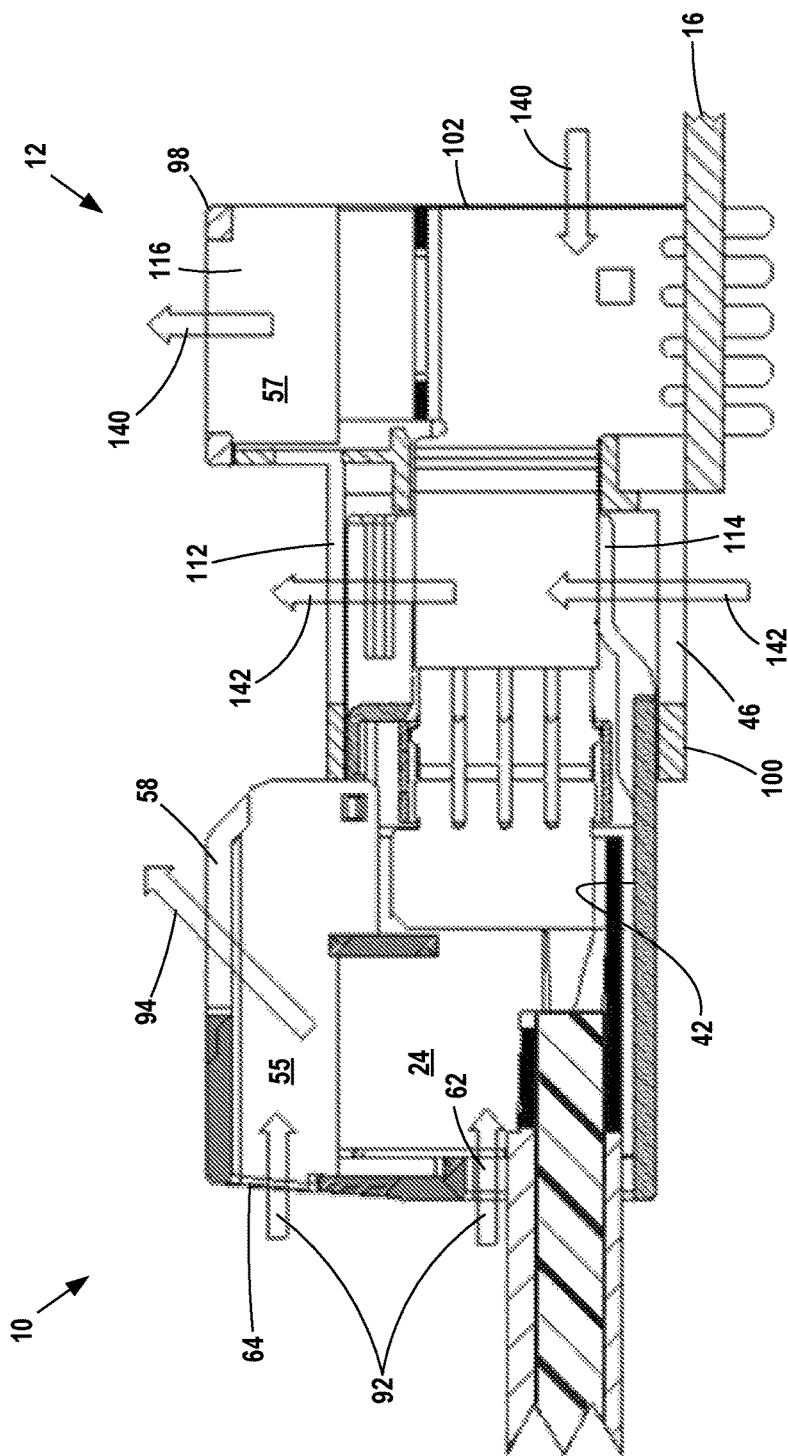
FIG. 8 is a vertical sectional view taken along line 8-8 of FIG. 7.

Cable contact housing 18 of assembly 10 includes molded plastic body 34 and molded plastic cover 36. Body 34 and cover 36 are shown in FIGS. 1, 2, 3, 6 and 9. Body 34 extends from insertion end 38 to cable end 40. Two side-by-side contact recesses 42 extend between body ends 38 and 40. The contact recesses 42 are illustrated in FIGS. 6 and 8.

Figure 9:
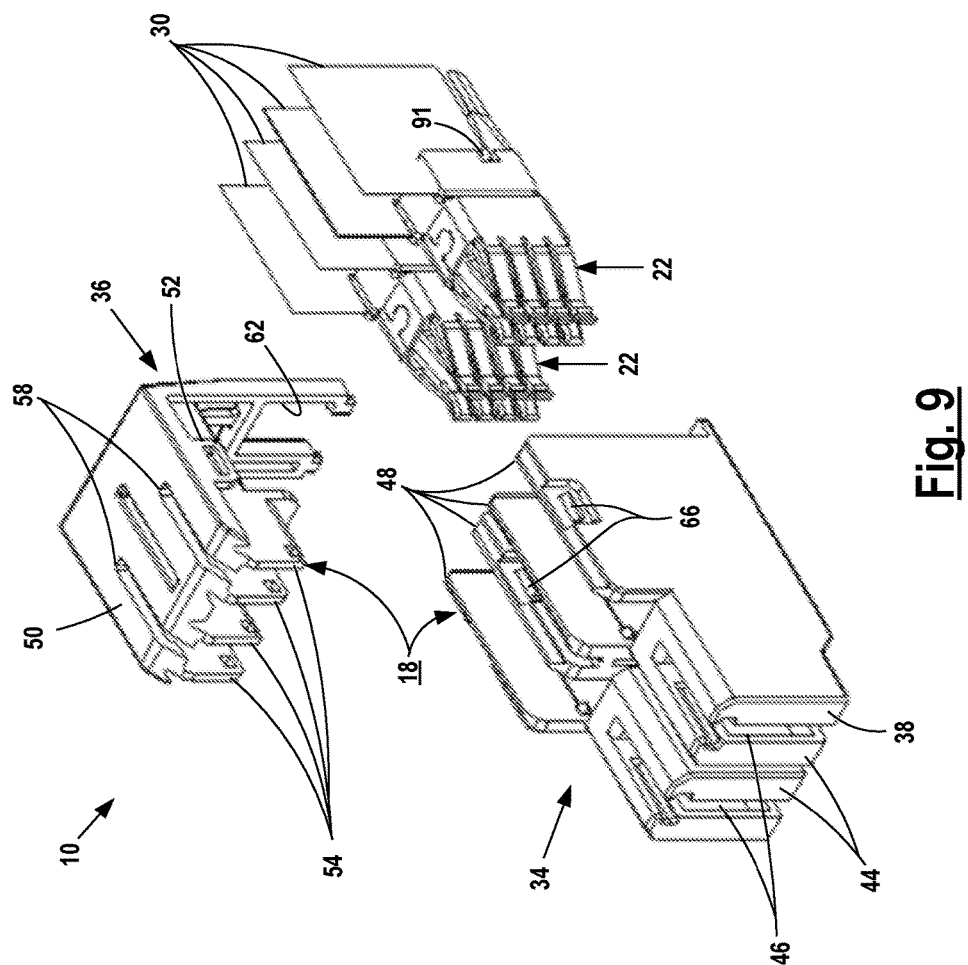
FIG. 9 is an exploded reverse perspective view of a cable electrical connector assembly before contacts are crimped to power cables.

Body 34 includes two side-by-side contact noses 44 at insertion end 38. Contact recesses 24 extend into noses 44. Vertical slots 46 extend through the top and the bottom walls of noses 44 at ends 38. Vertical walls 48 extend above the opposite sides of recesses 42 between noses 44 and cable end surface 40, as shown in FIG. 9.

Cover 36 includes a top wall 50 fitted over the upper ends of walls 48 with four flexible latch openings 52 below and spaced across wall 50. Openings 52 engage four latches 66 on body 34 when the cover is mounted on the body, as shown in FIG. 6.

Four spaced heat transfer surfaces 54 extend down from front portion of top wall 50. These walls have a tight fit surface-to-surface engagement with the interior surfaces of the vertical walls 48 of each recess 24 as shown in FIG. 6. When the cover 36 is latched onto body 34 heat transfer strips 30 attached to cable conductor contacts 22 are sandwiched tightly between walls 48 and 54 for effective conductive heat flow from the strips 30 to the plastic in cover 36 and flow through the plastic to surfaces 55 in the upper portions of recesses 24. The heat flows out from surfaces 55 to heat surrounding air. Surfaces 55 are inside housing 18. A vent slot 58 is formed on the lead end of cover 36 over each recess 24. Air in recesses 24 is heated by hot surfaces 55. Heated air rises by convection out of the recesses through slots 58 and is dissipated. Cooler air is drawn into the recesses through vent openings 64.

Cover 36 is mounted on top of walls 48 and against rear surface 40 of body 34. Two side-by-side cable vent openings 62 and a set of vent openings 64 extend through the top and bottom of cover wall 60. Four flexible latch openings 52 on the cover extend over and then latch behind four latches 66 formed on the sides of walls 48 facing outwardly from recesses 24.

Figure 11:
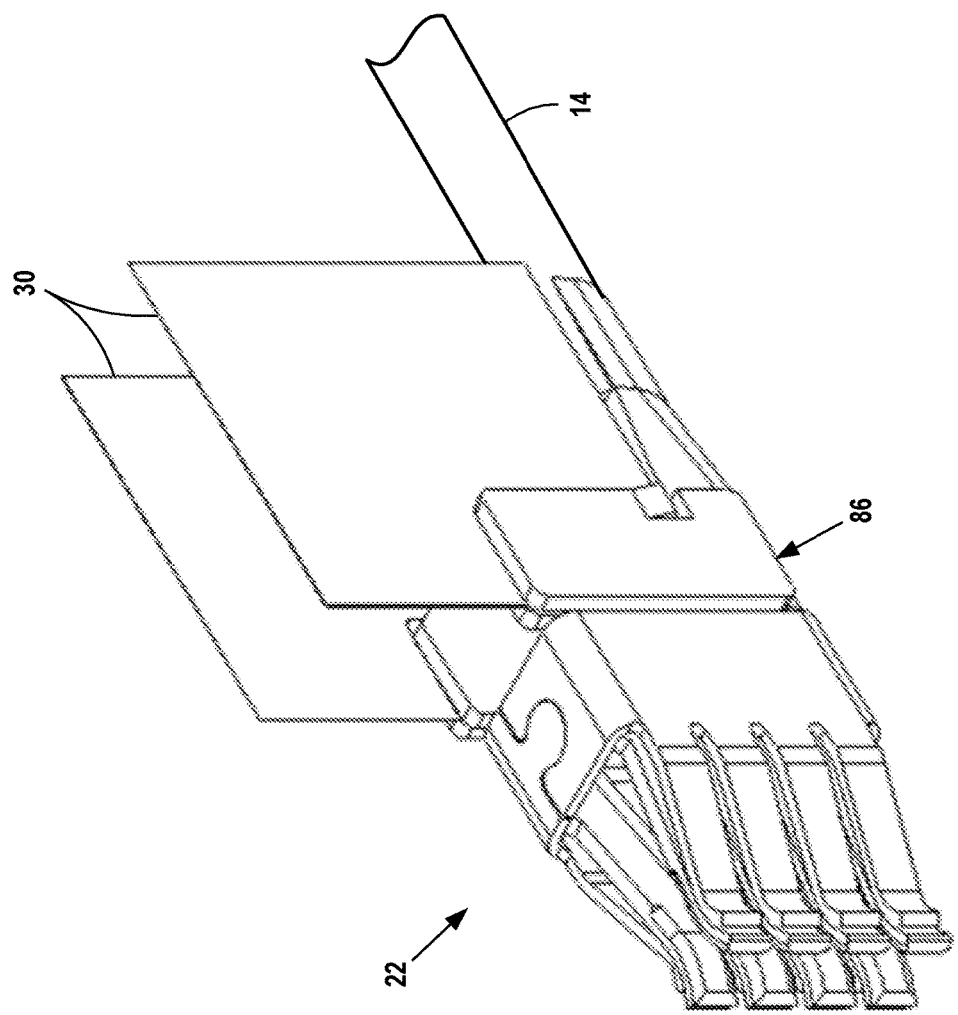
FIG. 11 is a perspective view of a cable connector contact and heat transfer strips.
Figure 12:
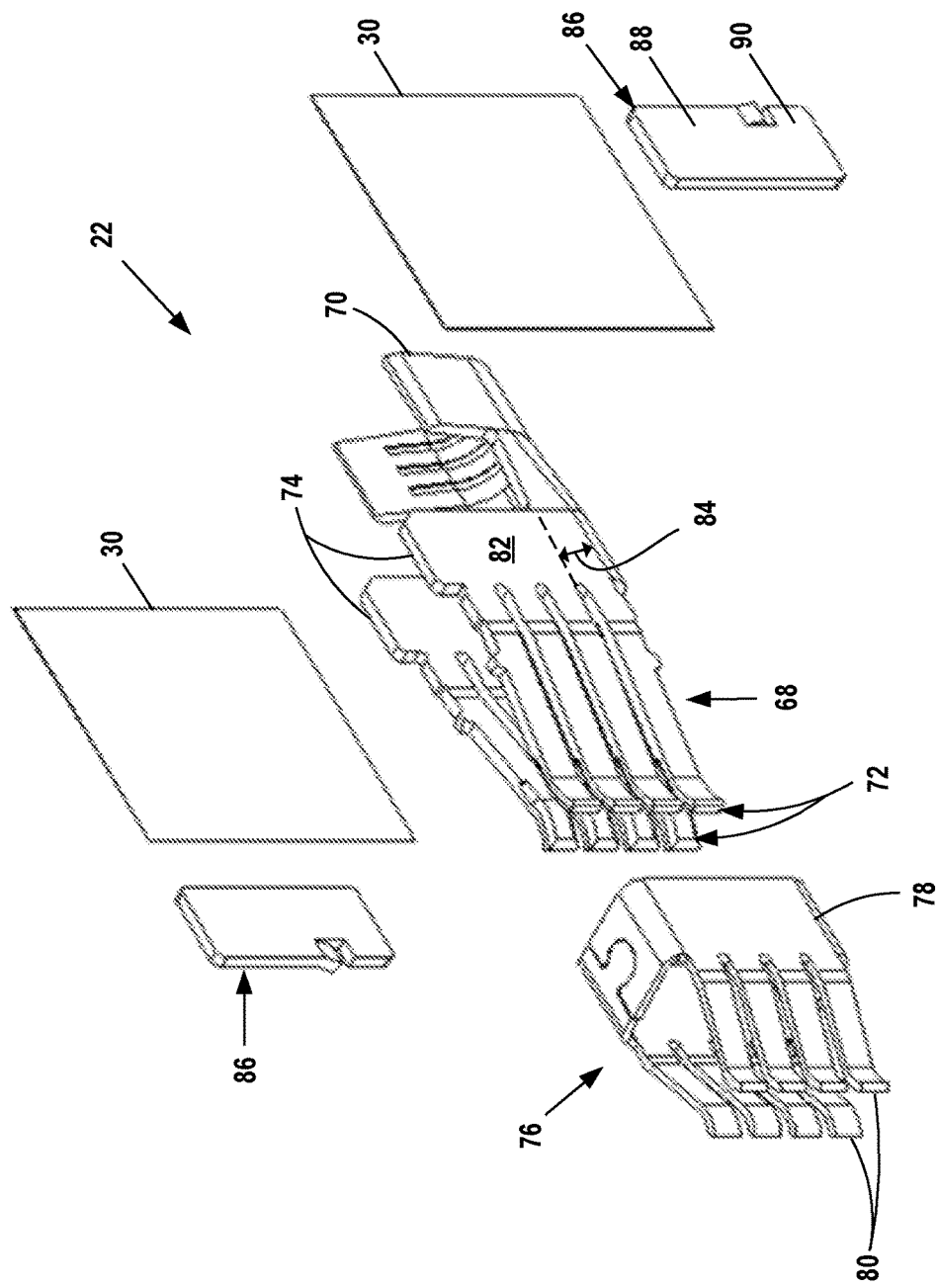
FIG. 12 is an exploded view of the contact and strips of FIG. 11.

Cable contacts 22 are shown in FIGS. 11 and 12. The contacts 22 are fitted into body 34 before the cover 36 is latched to the body. Each contact 22 includes a metal contact member 68 having a crimp barrel 70 at one end and two opposed sets of cantilever contact fingers 72 at the other end. The fingers 72 extend outwardly from opposed support walls 74 and are joined to barrel 70. A high tensile strength helper spring 76 has a rectangular mounting band 78 wrapped around the inner ends of fingers 72 and resilient helper spring arms 80 which overlie contact fingers 72.

The forward portions of conductive strips 30 overlie the flat outer surfaces 82 of walls 74. The lower edges of strips are spaced distances 84 above the bottoms of the support walls 74.

Strips 30 are clamped against outer surfaces 82 of contact member 68 by clamp plates 86. The plates each include an upper clamp portion 88, which overlies a strip 30, and a lower mounting portion 90 below strip 30 engaging the lower portion of wall 74. Lower portion 90 of the clamp plate 86 is soldered or welded to the lower portion of the support wall 74 to hold plate 86 tightly against surface 82 and hold the strip in surface-to-surface clamped heat flow engagement with contact member 68. Latches 91 extend out from plates 86.

Stripped lead ends of power cables 14 are positioned in open crimp barrels 70 which are then crimped closed to form electrical connections with the cable conductors. With the contact members secured on the ends of the cables and with the strips 30 clamped on walls 74 the contacts are in position to be extended into recesses 42 as shown in FIG. 9. Cables 14 are not shown in FIG. 9.

When the contacts 22, strips 30 and cables are fully inserted into body 34, the fingers 72 are positioned in the front or lead ends of recesses 42 at slots 46. Strips 30 extend up above the contacts 22 along the interior surfaces of walls 48 to the tops of the walls. See FIG. 6.

Cover 36 is then lowered onto the rear top of the body 34 and is held in place as shown in FIGS. 3 and 6 by four latches engaging four latch openings 52. The latches are on the outside of recesses 24 away from strips 30.

The heat transfer walls 54 extend down from the top of cover 36 to tightly clamp the upper ends of strips 30 against the interior surfaces of vertical walls 48. Tight, clamped engagement with the tops of strips provides efficient surface-to-surface heat flow engagement so that heat generated by the flow of electricity through the contact flows to the clamped lower portions of the strips 30, up along the strips and to walls 54.

Figure 10:
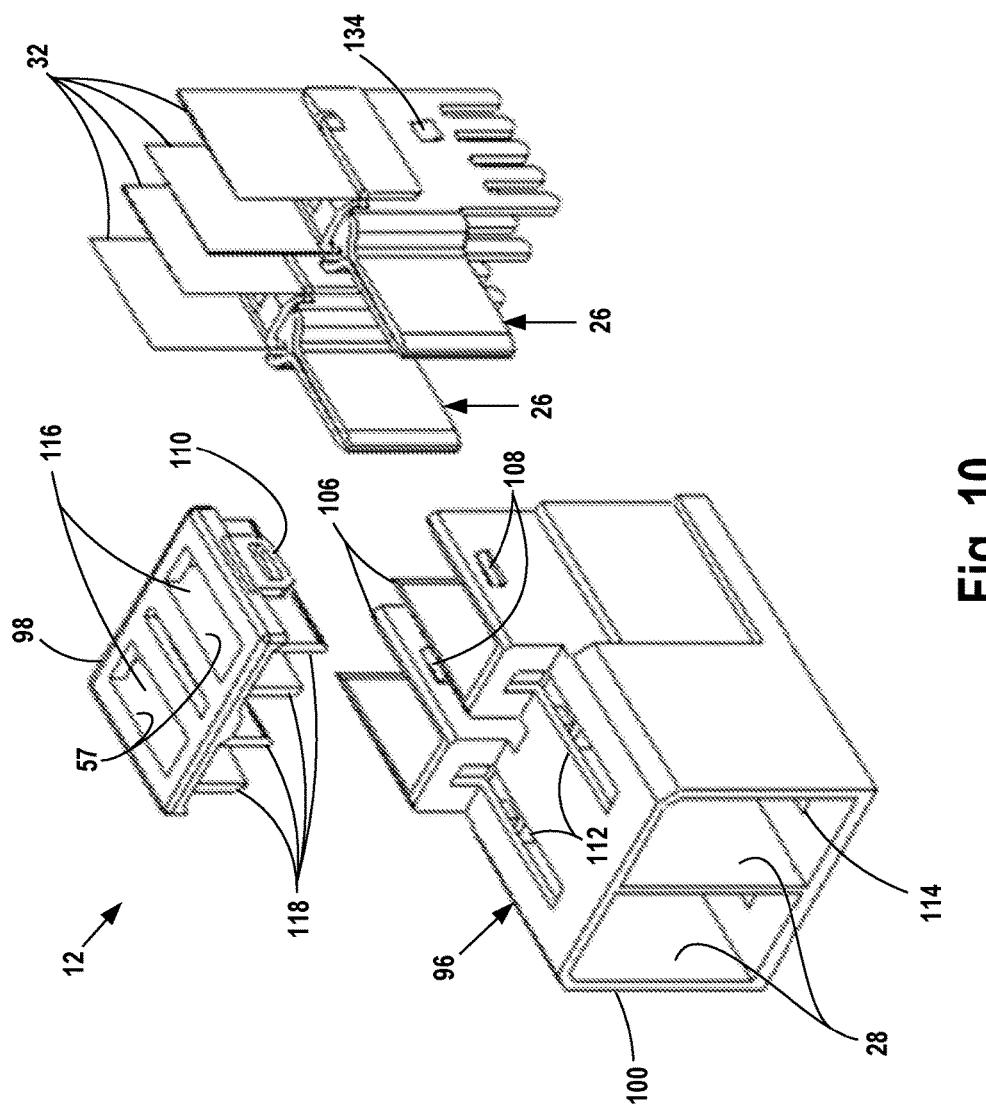
FIG. 10 is an exploded perspective view of the circuit board electrical connector assembly before mounting on a circuit board.

Circuit board electrical connector assembly 12 is shown in FIG. 10. Molded plastic body 96 includes a forward shell 100 facing away from circuit board 16 and forming the lead ends of side-by-side contact recesses 28. Each recess 28 extends from the shell 100 to a vertical vent opening 102 at the end of body 96 away from assembly 10. The circuit board end 104 of body 96 faces away from shell 100 and defines vent opening 102. Circuit board contact recesses 28 extend from shell 100 to body end 104. Two U-shaped cover support walls 106 extend around the upper open ends of recesses 28 above circuit board 16 and away from shell 100. Latches 108 are provided on the outer surfaces of the walls 106 for engaging four flexible latch openings 110 on the cover when the cover is mounted on body 96.

Elongate vent slots 112 are formed in the top of shell 100 the forward ends of recesses 28. Complimentary vent openings 114 are formed through the bottom wall of shell 100 below slots 112.

Cover 98 includes a vent slot 116 over the circuit board end of each recess 28. Two pairs of rigid heat transfer walls 118 extend downwardly from the cover. Walls 118 are located just inside on the opposed recess walls. Flexible latch openings 110 are located outside the recess walls. Heat transfer surfaces 55 are on the inner sides of walls 118. Like heat transfer surfaces 57 are provided on the inner sides of vent slots 116 in assembly 12 as shown in FIGS. 8 and 10.

Figure 13:
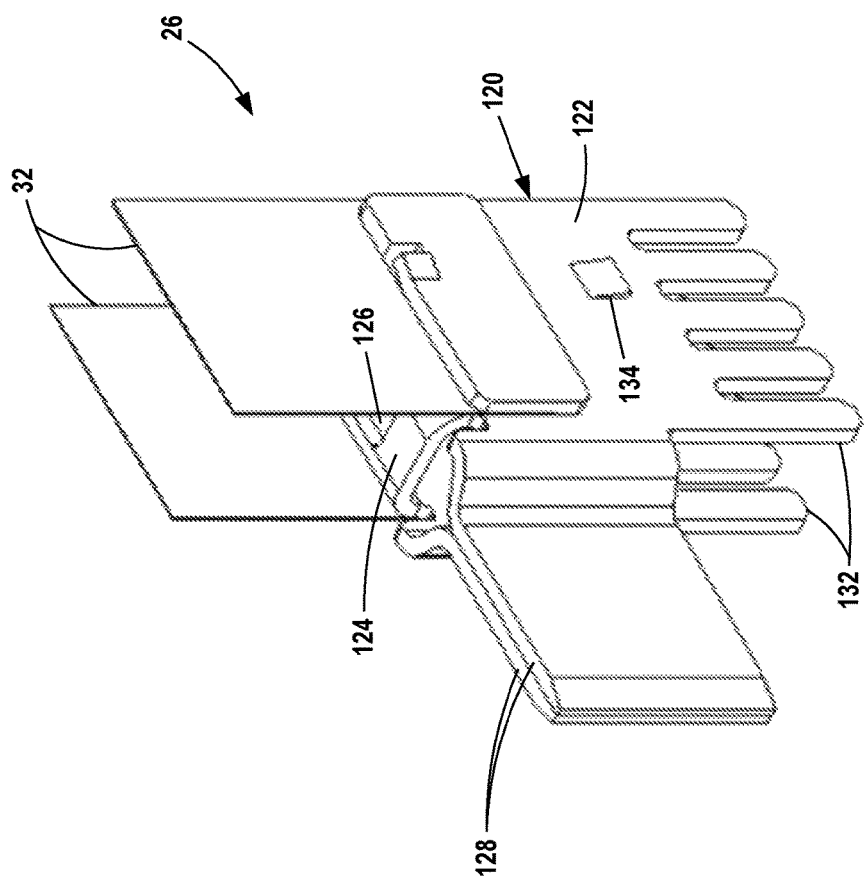
FIG. 13 is a perspective view of a circuit board contact and heat conducting strips.
Figure 14:
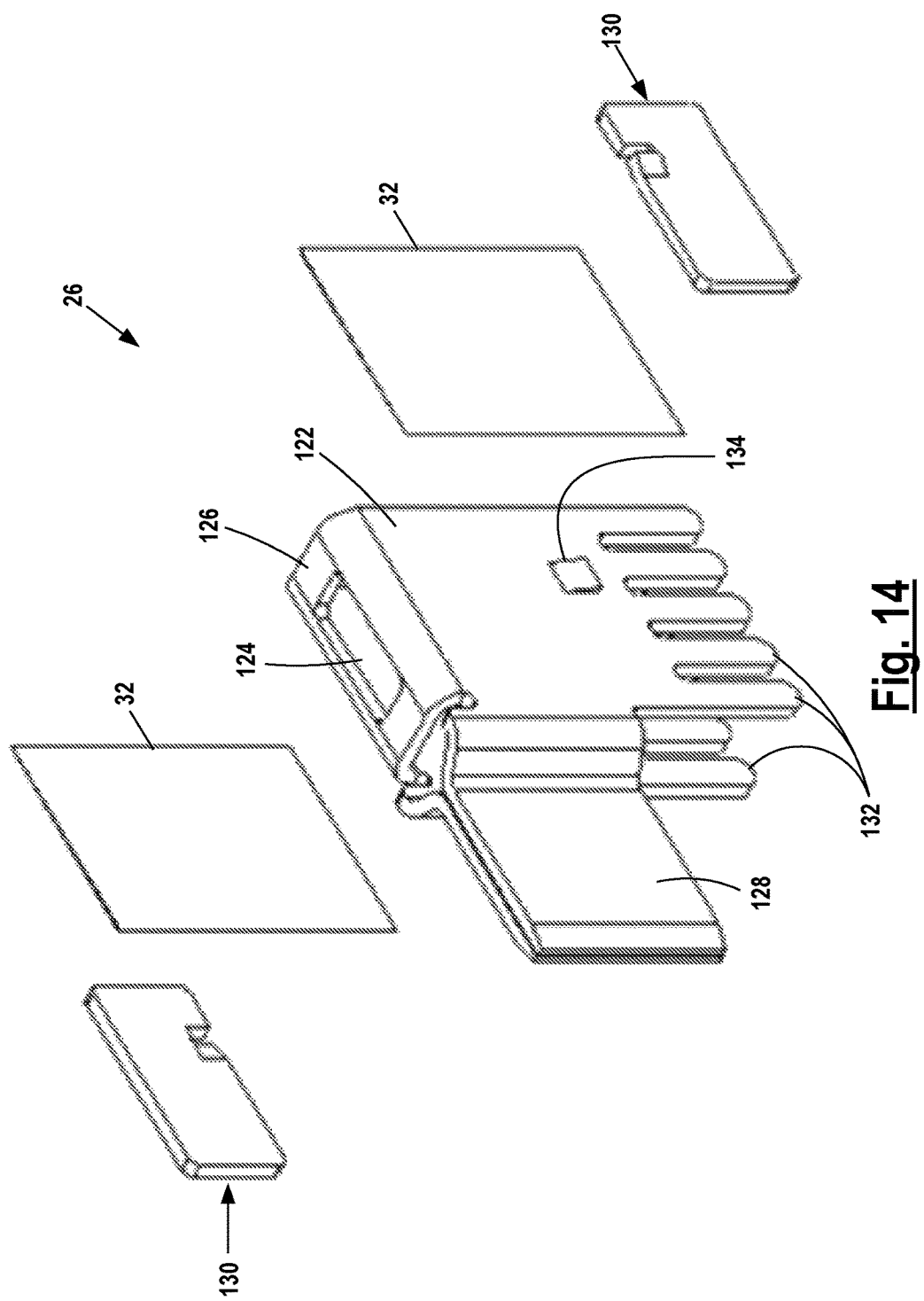
FIG. 14 is an exploded view of FIG. 13.

Circuit board contacts 26 are shown in FIGS. 13 and 14. Each contact 26 includes a metal contact member 120 having a pair of opposed, flat sides 122 joined at the top of the contact by transverse wall 124 so that the contact has an inverted U-shape. Vent opening 126 extends through the top transverse wall 124. Overlapping plates 128 are joined to the edges of side walls 122 facing the cable electrical connector assembly 10 to form a contact blade insertable between fingers 72 to establish a lower resistance electrical connection between assemblies and 10 and 12.

Strips 32 are secured to the upper portions of the outer walls of side members 122 as shown in FIG. 13. The strips 32 are held in place on contact 26 by clamp plates 130, similar to plates 86. The upper portions of clamp plates 130 overlie the lower portions of strips 32. The lower portions of plates 130, below strips 32, are secured to side members 122 by soldering or welding to tightly clamp the lower ends of the strips 32 against the sides of the contact and establish clamped surface-to-surface heat flow connections between the contacts and the strips. Heat generated by current flowing through contacts 26 flows to strips 32. Contacts 26 include a number of solder fingers 132 extending down from the lower end of each contact side member 122.

Figure 4:
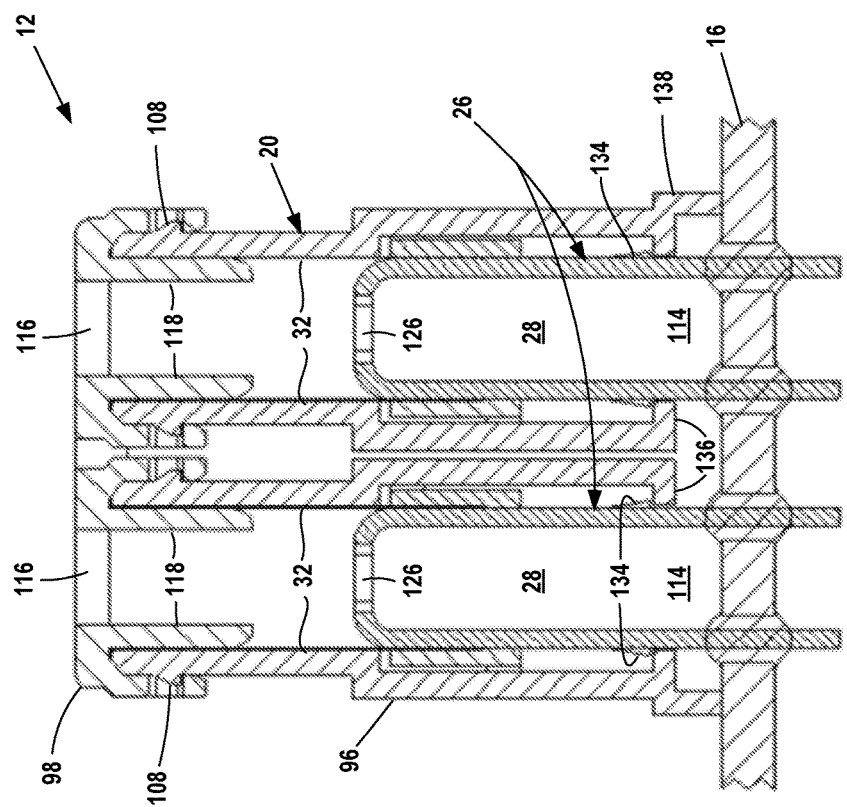
FIGS. 4, 5 and 6 are vertical sectional views taken along lines 4-4, 5-5, and 6-6 respectively of FIG. 3.
Figure 5:
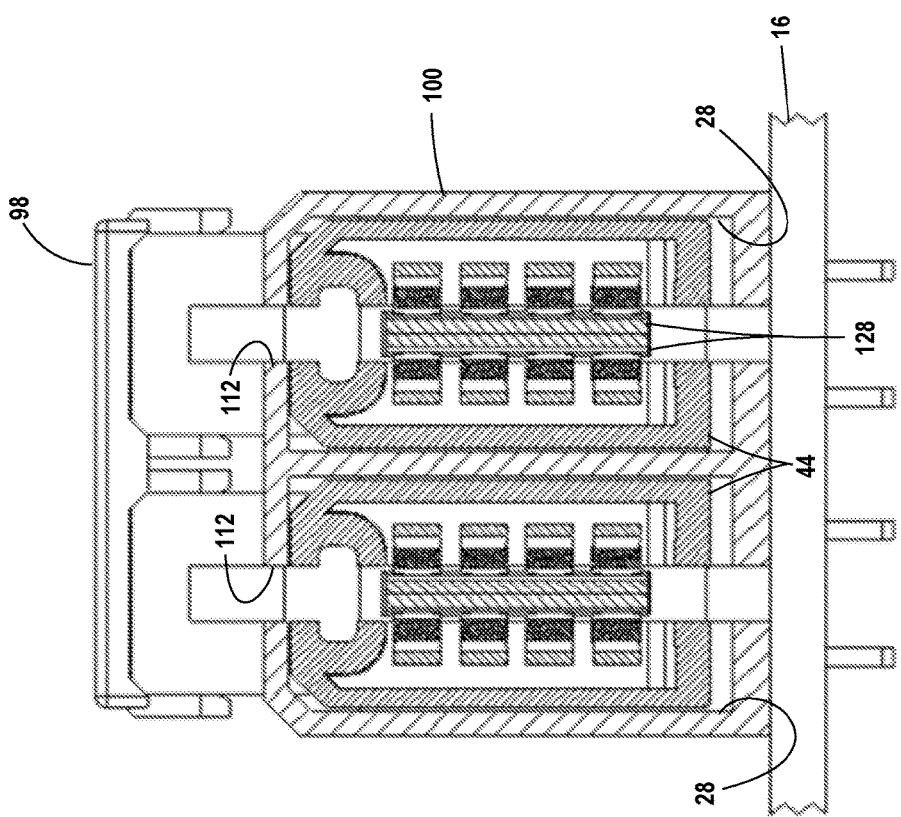

Cover 98 is attached to the top of the housing as shown in FIG. 4. Heat transfer walls 118 are piloted into the open upper ends of recesses 28 inside the upper ends of strips 32. The cover is then pushed down onto the top body 96 to move walls 118 down into the upper ends of the recesses 28 and form pressure surface-to-surface heat flow connections between walls 118 and both sides of the upper ends of strips 32 and the upper portion of housing 20. Flexible latch openings 110 move over latches 108 to form four latched connections holding the cover in place and maintaining the heat flow connections between the strips and the transfer walls 118 on the inside of the recesses 28. High pressure surface-to-surface heat flow connections are also formed between the upper ends of the strips and the upper ends of the walls forming recesses 28.

Each circuit board contact 26, with strips 32 attached as described, is fitted in the circuit board end of each recess 28 as shown in FIG. 4. The contacts are held in place by latches 134 formed in the lower portions of side members 122. The latches engage the walls 136 at the bottom of housing 20. The housing bottom wall 138 rests flush on the top surface of board 16. Fingers 132 extend through holes in board 16 and are press fitted or soldered in the holes to form electrical connections with circuitry on board 16.

Electrical connections are established between power cables 14 and printed circuitry in circuit board 16 by mounting cable electrical connector assembly 10 on the cables 14, as described and mounting circuit board electrical connector assembly 12 on the circuit board, as described. The assemblies 10 and 12 are positioned as shown in FIG. 1 and are then moved together to extend the lead end of the cable assembly into shell 100 to extend the pairs of plates 128 into slots 46 and between contact fingers 72 to form plural high pressure electrical connections between the plates 128 and the fingers 72 for transmission of electrical current between the conductors in the cables and circuitry in board 16. Helper springs 76 increase the contact pressure between fingers 72 and plates 128 to reduce resistance.

Current flowing through the engaged assemblies 10 and 12 generates heat which increases the temperature of the cable contacts 22 and the circuit board contacts 26. The strips 30 and 32 are secured in flat, high pressure surface-to-surface heat transfer contact with contacts 22 and 26 and rapidly convey heat away from the contacts, up through the assemblies 10 and 12 and to the plastic covers 36 and 98 at the tops of the assemblies. These covers are clamped against the upper ends of the strips in high pressure surface-to-surface heat transfer connections. Heat carried upwardly along the strips from the contacts is transferred into the covers and also into the plastic at the upper ends of the housing to heat the covers and the upper ends of the housing.

The covers transmit the heat to the inner heat transfer surfaces 55 and 118 which then transfer heat into the recesses by radiation and heat air in the recesses through convection. Convection flows the heated air up and out of the assemblies through slots 58 and 116 as indicated by arrows 94 and 140 in FIG. 8. Cooler air is drawn back into the interiors of the assemblies through vents 62 and 64, as indicated by arrows 92 and through vent openings 102 in assembly 12 as indicated by arrow 140.

As illustrated in FIG. 8, heat formed at the electrical connections between the cable contacts 22 and the circuit board contacts 26, inside shell 100, heats air inside the shell. Convection flows the heated air up away from the assemblies through slots 112 and 114 in shell 100 and slots 46 in body 34, as indicated by arrows 142 in FIG. 8.

In engaged assemblies 10 and 12, air is heated in recesses or chambers 24 and 28 inside the assemblies and flows up and out of the chambers through outlet slots 58 and 116. Additional cooler air is drawn into the chambers to replace the heated air through inlet vent openings 62 and 102. As illustrated in FIG. 8, multiple air flow paths are formed in engaged assemblies 10 and 12 to dissipate heat away from engaged contacts 22 and 26. A first air flow path is represented by arrows 92 and 94. A second air flow path is represented by arrows 92 and 94. A third air flow path is represented by arrows 140.

An electrical connection assembly may include a contact with a thermally conductive strip in surface-to-surface heat flow connection with the contact for flowing heat away from the contact where the heat is flowed to a plastic body having a surface outside of the assembly so that heat from the contact is transferred directly to and heats air outside of the assembly and is dissipated through radiation and convection.

Additionally, heat from a contact may be flowed to and along a strip to heat a body inside a chamber where heated air flows out from the assembly through one opening or vent and replacement air flows back into the assembly through same opening or vent. Separate openings or vents for flowing air into and out from the assembly are not required.

The strips 30 and 32 effectively flow heat along their lengths. The strips may be electrically conductive. Strips 30 and 32 are located inside the assemblies 10 and 12 and are shielded by the assemblies from external contact and unintended shocks or short circuits. Strips with exposed portions may have plastic outer covers to prevent shocks or short circuits.

The covers 36 and 98 are tightly clamped against the upper ends of the strips so that heat flowed along the strips heats the resins and is convected and radiated from the covers to heat surrounding air for flow of the heated air away from the assemblies. The heat transfer efficiency of the assemblies is affected by the thermal conductivity of the resins forming covers 36 and 98. The covers may be molded from resins having a relatively high thermal conductivity (W/m K), greater than the thermal conductivity of conventional resins used for molding connector housings.

The covers may be molded from the following high thermal conductivity resins:

| Thermally Conductive Material | Thermal Conductivity (W/m K) |
| --- | --- |
| PP (D1201) | 5.00 |
| PA | 1.9 |
| COPE | 2.3 |
| PPS (D5108 | 10 |
| PPS (D5110 | 2 |
| LCP (D5502 | 1.46 |
| LCP (D5506) | 10 |
| PA66 (PolyOne) | 19-21 |
| PPS (PolyOne) TT9200-8708 EC | 14-15 |
| PBT (PolyOne) | 2 |

Other high thermal conductivity resins may be used.

The heat flow efficiency may be increased by securing the upper ends of the strips in surface-to-surface heat transfer engagement with metal bodies having a heat radiating surface facing the interior of the housing or facing the exterior of the housing. The metal bodies may be extruded or diecast magnesium or aluminum. Extruded aluminum has a high thermal conductivity of 150 and diecast magnesium or aluminum has a thermal conductivity between 50 and 100. The bodies may be machined from metal preforms.

The strips are electrically conductive so that a metal heat-radiating body clamped against the upper ends of the strips would be electrically conductive. An exposed surface of a metal heat conducting body should be shielded to prevent shock or short circuits.

Conductive strips 30 and 32 are preferably formed from pyrolytic highly oriented graphite sheets (PGS). The sheets are typically made from graphite and have a structure close to a single crystal. PGS graphite sheets may have a thermal conductivity of about 600-1700 W/[mK].

High pressure heat flow electrical connections are required for efficient flow of heat into and away from the conductive strips 30 and 32. Clamp plates 86 and 130 clamp the ends of strips 30 and 32 against contacts 22 and 26 with a clamp pressure of about 3 kg per cm$^2$. The upper ends of the strips are likewise tightly clamped between the housing bodies and covers, as illustrated in FIGS. 4 and 6.

The cable and circuit board assemblies 10 and 12 are of compact design and extend about 29 mm above circuit board 16. The PGS strips 30 and 32 are located in assemblies 10 and 12 and have a vertical height of about 18 mm.

We claim:

1. A heat dissipating power electrical connector assembly comprising:
 a contact housing formed from dielectric material, the housing comprising an interior contact recess, a contact vent opening and a contact vent slot located above the contact vent opening, the interior contact recess extending from the contact vent opening to the contact vent slot, the contact vent opening and contact vent slot extending to the exterior of the contact housing;
 a metal member comprising a contact and a conductor in the contact recess;
 a heat dissipating body comprising a body heat receiving surface and a body air heating surface;
 a non-metal heat transmitting member comprising opposed ends, a first heat receiving surface on one end of the member and a first heat radiating surface on the other end of the member;
 a first clamped surface-to-surface heat flow connection in the housing between the conductor and the first heat receiving surface; and
 a second clamped surface-to-surface heat flow connection between the first heat radiating surface and the body heat receiving surface;
 an unclamped heat flow connection between the body air heating surface and air at such surface;
 wherein the heat transmitting member flows heat from the conductor to the heat dissipating body, the heat dissipating body flows heat to the air heating surface, and the air heating surface heats adjacent air for dissipation of the heat away from the conductor through the contact housing.

2. An assembly as in claim 1 wherein the heat transmitting member comprises a strip.

3. An assembly as in claim 2 wherein the strip is flat and the heat flow connections are flat.

4. An assembly as in claim 3 wherein the pressure at the first clamped connection is about 3 kg/cm$^2$.

5. An assembly as in claim 4 wherein the first clamped connection comprises a clamp member securing the heat receiving surface against the conductor.

6. An assembly as in claim 2 wherein the heat transmitting member has a thermal conductivity of at least about 600 W/[mK].

7. An assembly as in claim 3 wherein the heat dissipating body is formed from a non-metal.

8. An assembly as in claim 3 including a non-metal member holding the heat transmitting member against the heat dissipating body.

9. An assembly as in claim 8 wherein said non-metal member comprises a plastic body.

10. An assembly as in claim 1 wherein the clamp pressure at the first clamped connection is about 3 kg/cm$^2$.

11. An assembly as in claim 10 wherein the clamp pressure at the second clamped connection is about 3 kg/cm$^2$.

12. An assembly as in claim 1 wherein the heat dissipating body is in the interior contact recess.

13. An assembly as in claim 1 wherein the heat transmitting member comprises a strip of pyrolytic highly oriented graphite.

14. An assembly as in claim 1 wherein the first heat radiating surface is in the interior contact recess.

15. An assembly as in claim 1 wherein the air heating surface is adjacent the vent slot.

16. An assembly as in claim 1 wherein the contact vent opening, the interior contact recess and the contact vent slot comprise an air flow path within heat dissipates away from the conductor along the air flow path.

17. The method of lowering the temperature of a contact in an electrical connector assembly, comprising the steps of:
 a. providing a dielectric contact housing with a contact recess in the housing and a contact opening and a metal conductor in the recess with a contact at or adjacent to the contact opening and an elongate non-metal heat transmitting member;
 b. flowing current through the contact to heat the contact;
 c. flowing heat from the contact to one end of an elongate heat transmitting member at a clamped surface-to-surface heat flow connection between the contact and such end of the heat transmitting member, along the length of the heat transmitting member to the opposite end of the heat transmitting member, and flowing the heat through a second clamped surface-to-surface heat flow connection to a first heat receiving surface on a non-metal heat dissipating member located away from the contact;
 d. flowing heat from the first heat receiving surface on the non-metal heat dissipating member to a first heat radiating surface on the non-metal heat dissipating member; and
 e. flowing heat from the first heat radiating surface into adjacent air within the recess to heat the air for dissipation of the heat away from the contact and the air to the exterior of the recess.

18. The method of claim 17 including the step of:
 f. flowing heated air within the recess and a from the conductor into the heat transmitting member through a flat heat flow connection having a clamp pressure of about 3 kg/cm$^2$ or greater than 3 kg/cm$^2$.

19. The method of claim 17 including the step of;
 f. flowing heat from the conductor to the heat transmitting member along a PGS strip.

20. The method of claim 17 including the step of:
 f. flowing heat from the conductor to the heat dissipating member along a heat transmitting member having a thermal conductivity of about 600-1700 W/[mK].

21. The method of claim 17 including the step of:
 f. providing an air flow path extending through the recess, flowing heated air along the air flow path from the interior of the recess and through a first air flow opening to the exterior of the recess and drawing cooler air along the air flow path from the exterior of the recess and through a second air flow opening to the interior of the recess, the first air flow opening located above the second air flow opening.

22. A electrical connector assembly comprising:
 a contact housing formed from dielectric material, the housing comprising an interior contact recess and a contact opening, the contact opening extending from the interior contact recess to the exterior of the contact housing;
 a metal member comprising a contact and a conductor, the conductor in the contact recess, the contact in or adjacent to the contact opening;
 a heat dissipating body comprising a body heat receiving surface and a body air heating surface;

a non-metal, flat heat transmitting strip comprising opposed ends, a first heat receiving surface on one end of the member and a first heat radiating surface on the other end of the member;

a first flat clamped surface-to-surface heat flow connection in the housing between the conductor and the first heat receiving surface; and a second flat clamped surface-to-surface heat flow connection between the first heat radiating surface and the body heat receiving surface;

an unclamped heat flow connection between the body air heating surface and air at such surface;

a non-metal member holding the heat transmitting strip against the heat dissipating body;

wherein the heat transmitting strip flows heat from the conductor to the heat dissipating body, the heat dissipating body flows heat to the air heating surface, and the air heating surface heats adjacent air for dissipation of the heat away from the conductor.

23. An assembly as in claim 22 wherein the pressure at the first or second clamped connection is about 3 kg/cm$^2$.

24. An assembly as in claim 23 wherein the first clamped connection comprises a clamp member securing the heat receiving surface against the conductor.

25. An assembly as in claim 22 wherein the heat transmitting member has a thermal conductivity of at least about 600 W/[mK].

26. An assembly as in claim 22 wherein the heat dissipating body is formed from a non-metal.

27. An assembly as in claim 22 wherein said non-metal member comprises a plastic body.

28. An assembly as in claim 22 wherein the heat dissipating body is in the contact recess.

29. An assembly as in claim 22 wherein the strip comprises pyrolytic highly oriented graphite.

30. An assembly as in claim 22 wherein the member heat radiating surface is in the contact recess and including means for flowing air into and out of the recess.

31. An assembly as in claim 22 including one or more air flow openings in the contact housing.

32. An assembly as in claim 22 including an air inflow opening in the contact housing, and an air outflow opening in the contact housing, the outflow opening located above the inflow opening.

33. The assembly as in claim 16 comprising a second contact vent slot and a second contact vent opening, the second contact vent slot, the interior contact recess and the second contact vent opening comprising a second air flow path.

* * * * *